(12) United States Patent
Li

(10) Patent No.: US 12,136,551 B2
(45) Date of Patent: Nov. 5, 2024

(54) METHOD FOR FORMING FinFET SUPER WELL

(71) Applicant: SHANGHAI HUALI INTEGRATED CIRCUIT CORPORATION, Shanghai (CN)

(72) Inventor: Yong Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 590 days.

(21) Appl. No.: 17/491,090

(22) Filed: Sep. 30, 2021

(65) Prior Publication Data
US 2022/0384193 A1 Dec. 1, 2022

(30) Foreign Application Priority Data
May 31, 2021 (CN) .......................... 202110597507.X

(51) Int. Cl.
*H01L 21/265* (2006.01)
*H01L 21/308* (2006.01)

(52) U.S. Cl.
CPC .... *H01L 21/26513* (2013.01); *H01L 21/3086* (2013.01)

(58) Field of Classification Search
CPC ..... H01L 21/823431; H01L 21/823821; H01L 27/0886; H01L 27/0924; H01L 29/66795; H01L 29/785; H01L 21/7851; H01L 21/2253; H01L 21/3086; H01L 21/26513
See application file for complete search history.

(56) References Cited

U.S. PATENT DOCUMENTS

| | | | | |
|---|---|---|---|---|
| 8,575,708 B2 * | 11/2013 | Lin | ................... | H01L 29/66795 257/327 |
| 9,634,087 B1 * | 4/2017 | Xie | ...................... | H01L 29/0638 |
| 10,763,259 B2 * | 9/2020 | Zhou | .................. | H01L 29/0649 |
| 2004/0150029 A1 * | 8/2004 | Lee | ................... | H01L 29/66795 257/308 |
| 2008/0160772 A1 * | 7/2008 | Kong | ................. | H01L 21/0332 257/E21.214 |

(Continued)

FOREIGN PATENT DOCUMENTS

| | | | | |
|---|---|---|---|---|
| CN | 107785424 | * | 3/2018 | ....... H01L 29/66795 |
| CN | 106856190 | * | 12/2019 | ......... H01L 21/8234 |

(Continued)

*Primary Examiner* — Mary A Wilczewski
(74) *Attorney, Agent, or Firm* — Banner & Witcoff, Ltd.

(57) ABSTRACT

A method for forming a FinFET super well, forming a deep well and a well region in a silicon substrate, followed by formation the fin structure under a hard mask layer; etching a first portion of a fin, performing the first ion implantation for adjusting the threshold voltage at a first height of the fin, the hard mask layer protects the fin structures from ion implantation damages to the fin top; etching a second portion of the fin, performing the second anti-punch through ion implantation at the second height, and in annealing, the implanted ions laterally diffuse into the fin. Finally, the deep well, the well region, the first ion implantation layer for adjusting the threshold voltage, and the second ion implantation layer for anti-punch through jointly form the FinFET super well, which increases the carrier mobility, thereby improving the device performance.

8 Claims, 7 Drawing Sheets

(56) References Cited

U.S. PATENT DOCUMENTS

| | | | | |
|---|---|---|---|---|
| 2013/0105914 A1* | 5/2013 | Lin | ................... | H01L 29/66795 |
| | | | | 257/E21.409 |
| 2013/0252349 A1* | 9/2013 | Pradhan | .............. | H01L 21/2658 |
| | | | | 438/4 |
| 2016/0225906 A1* | 8/2016 | Wang | ................... | H01L 21/2253 |
| 2018/0012888 A1* | 1/2018 | Zhou | ................... | H01L 29/0607 |
| 2019/0006361 A1* | 1/2019 | Zhou | ................. | H01L 29/66795 |
| 2021/0391183 A1* | 12/2021 | Chiu | ................... | H01L 21/0337 |
| 2022/0384193 A1* | 12/2022 | Li | ........................ | H01L 29/7851 |

FOREIGN PATENT DOCUMENTS

| | | | | |
|---|---|---|---|---|
| CN | 112151594 | * 12/2020 | ........... | H01L 21/336 |
| CN | 113394106 | * 9/2021 | ........... | H01L 29/785 |

* cited by examiner

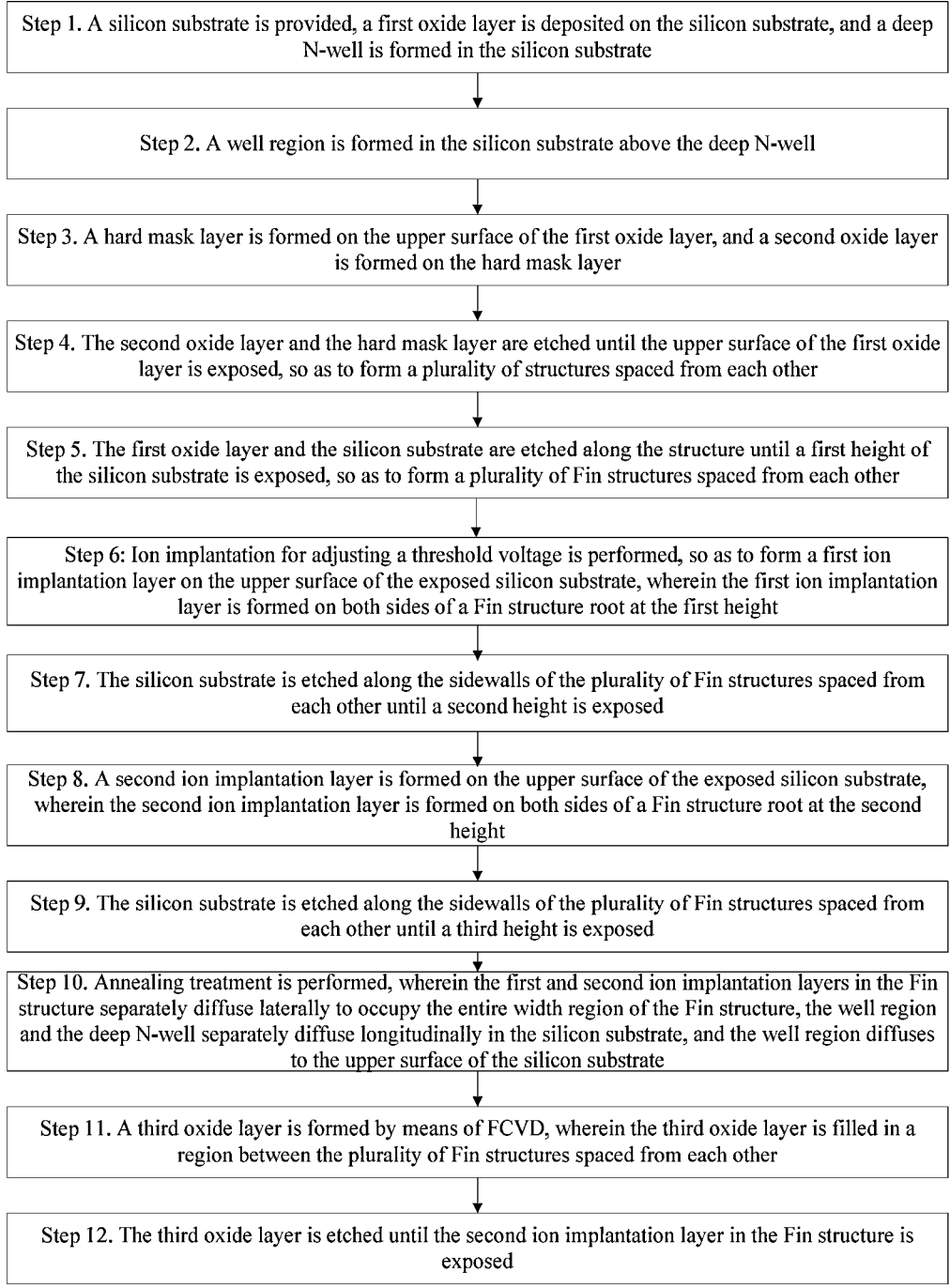
FFIG. 14

METHOD FOR FORMING FinFET SUPER WELL

CROSS-REFERENCES TO RELATED APPLICATIONS

This application claims the priority to Chinese patent application No. CN202110597507.X, filed on May 31, 2021 at CNIPA, and entitled "METHOD FOR FORMING FINFET SUPER WELL", the disclosure of which is incorporated herein by reference in entirety.

TECHNICAL FIELD

The present application relates to the technical field of semiconductor chip manufacturing, in particular to a method for forming a FinFET super well.

BACKGROUND

As the scale of the MOS devices continues to expand, fin transistor (FinFET) devices have become an advanced technological expansion of the CMOS. One of the main advantages of the FinFET device structure is its superior electrostatic integrity, which depends on the channel morphology to a large extent. FIG. 1a is a schematic diagram of a FinFET structure in the current process, wherein the fin (FIN) is wrapped by the metal gate (MG) below the height Hfin at the top of the FIN, and the lower part of the FIN has a greater risk of being penetrated, in particular when the source and drain channels are deeper and their doping concentrations are high.

Currently, there is a problem of damage occurring after anti-punch through APT imp doping by implantation. The FIN width at the top is narrower than at the bottom, so Wfin_top<Wfin_middle<Wfin_bottom. Since the doping concentration at the top of the FIN is extremely low, the carrier mobility is relatively high and the performance of FIN device is relatively good. The bottom of the FIN structure is highly doped and the ability of the dopant to diffuse upward into the channel is poor, thus hindering the improvement of the carrier mobility.

Referring to FIG. 1b, FIG. 1b is the distribution of the anti-punch through (APT) doping in the Y-axis versus the vertical dimension of the fin structure in the X-axis in the current process. FIG. 1b shows that APT doping concentration has a distribution with a peak and tails along the fin height Hfin and fin width Wfin.

BRIEF SUMMARY

In view of the above-mentioned defect in the current process, the present application provides a method for forming a FinFET super well, to increase mobility in a channel at the FIN bottom and to avoid the risk of punch through at the FIN bottom.

, The present application provides a method for forming a FinFET super well, the method at least comprises the following steps:

step 1: providing a silicon substrate having a deep N-well, disposing a first oxide layer on the silicon substrate;

step 2: forming a well region in the silicon substrate above the deep N-well;

step 3: forming a hard mask layer on the first oxide layer, and forming a second oxide layer on the hard mask layer;

step 4: patterning the second oxide layer and the hard mask layer to form a plurality of structures until an upper surface of the first oxide layer is exposed after the patterning, wherein the plurality of structures is spaced from each other;

step 5: etching away the first oxide layer and the silicon substrate along the plurality of structures until a first height of each of the plurality of structures is reached;

step 6: performing a first ion implantation to form a first ion implantation layer at both sides of a root of each of the plurality of structures at the first height, wherein the first ion implantation adjusts a threshold voltage;

step 7: etching the silicon substrate along sidewalls of each of the plurality of fin structures until a second height is reached;

step 8: performing a second ion implantation to form a second ion implantation layer at both sides of a root of each of the plurality of structures at the second height;

step 9: etching the silicon substrate along the sidewalls of the plurality of fin structures until a third height is reached;

step 10: performing annealing treatment, wherein the first and the second ion implantation layers in the plurality of fin structures respectively diffuse laterally into a full width regions of each of the plurality fin structures, as well as diffuse longitudinally into the well region and the deep N-well, and an upper surface of the silicon substrate; and step 11: disposing a third oxide layer by means of FCVD, wherein the third oxide layer fills a region between two adjacent ones of the plurality of fin structures; and step 12: etching the third oxide layer until a side of the second ion implantation layer in one of the plurality of structures is exposed.

In some examples, the first height in step 5 is in the range of 5-20 nm. In some examples, the first ion implantation layer reaches into each side of the root of one of the plurality of fin structures at about ⅓ of a width of one of the plurality of fin structures in step 6.

In some examples, the first ion implantation layer in step 6 is applied to increase the threshold voltage.

In some examples, the second height of the fin structure in step 7 is in the range of 30-50 nm.

In some examples, the second ion implantation layer in step 7 is an anti-punch through ion implantation layer.

In some examples, the second ion implantation layer reaches into each side of the root of one of the plurality of fin structures at about ⅓ of a width of one of the plurality of fin structures.

on each side of the fin structure root at the second height in step 7 occupies about ⅓ of the width of the fin structure.

In some examples, the third height in step 9 is in the range of 70-150 nm.

As stated above, the method for forming a FinFET super well of the present application has the following beneficial effects: according to the present application, before the formation of the fin structure, the deep well and the well region are formed in the silicon substrate. After a portion of the fin is formed by etching, the ion implantation for adjusting the threshold voltage is performed, and the ion implantation laterally diffuses into the fin. However, due to the existence of the hard mask layer, there is no ion implantation damage to the top of the fin structure. After a second portion of the fin is formed by etching, the anti-punch through ion implantation is performed, and the implanted ions laterally diffuse into the fin. Finally, the structures made by the disclosed steps including the deep well, the well region, the ion implantation for adjusting the threshold voltage, and the anti-punch through ion implantation form the FinFET super well, have increased the carrier mobility, thereby improving the device performance.

BRIEF DESCRIPTION OF THE DRAWINGS

FIG. 14 is a flowchart of the method for forming a FinFET super well according to the present application.

DETAILED DESCRIPTION OF THE DISCLOSURE

The implementation of the present application is described below with specific examples, and those skilled in the art can easily understand other advantages and effects of the present application from the content disclosed in the description. The present application can also be implemented or applied in other different specific embodiments, and various details in the description can also be modified or changed on the basis of different viewpoints and applications without departing from the spirit of the present application.

Please refer to FIG. 2 to FIG. 14. It should be noted that the drawings provided in the embodiments only schematically illustrate the basic concept of the present application. The drawings only show the components related to the present application but are not drawn according to the number, shape, and size of the components in actual implementation. The type, quantity, and proportion of each component can be changed at random during actual implementation, and the component layout may be more complicated.

Figure 1A:
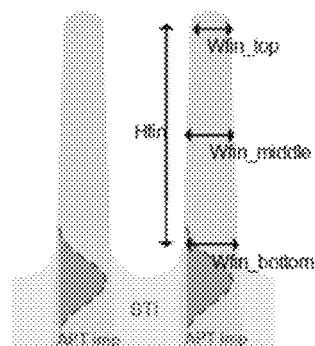
FIG. 1a is a schematic diagram of a FinFET structure from the current process.
Figure 1B:
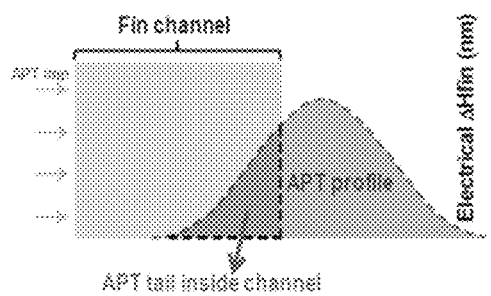
FIG. 1b shows the distribution of the anti-punch through (APT) doping in a fin structure in the Y-axis versus the vertical dimension of the fin structure in the X-axis in the current process.
Figure 2:
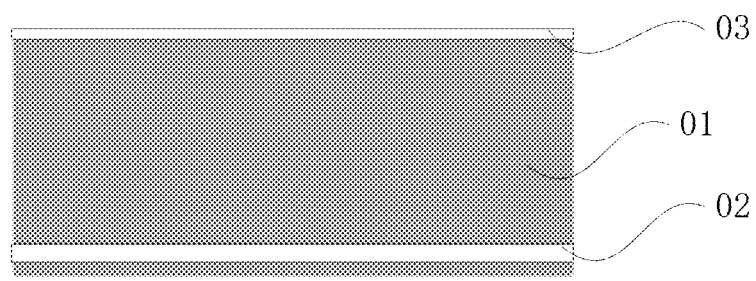
FIG. 2 is a schematic diagram of a structure with a first oxide layer formed on a silicon substrate and a deep N-well formed in the silicon substrate according to the present application.

The present application provides a method for forming a FinFET super well. FIG. 14 is a flowchart showing the method for forming a FinFET super well according to the present application. The method at least includes the following steps:

Step 1: providing a silicon, disposing a first oxide layer on the silicon substrate, and forming a deep N-well in the silicon substrate. FIG. 2 is a schematic diagram of a structure with the first oxide layer formed on the silicon substrate and the deep N-well formed in the silicon substrate according to the present application. In step 1, the first oxide layer 03 is deposited on the silicon substrate 01, and the deep N-well 02 is formed inside the silicon substrate 01.

Figure 3:
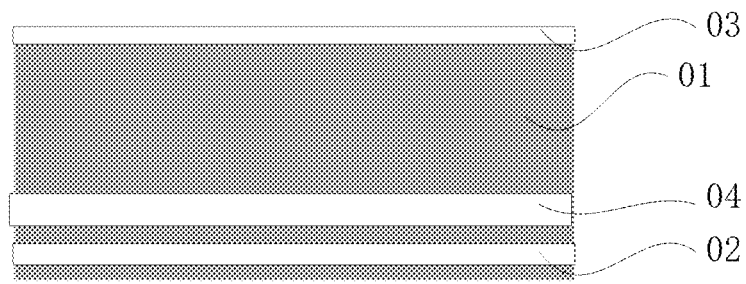
FIG. 3 is a schematic diagram of a structure with a well region formed in the silicon substrate according to the present application.

Step 2: forming a well region in the silicon substrate above the deep N-well. FIG. 3 is a schematic diagram of a structure with the well region formed in the silicon substrate according to the present application. In step 2, the well region 04 is formed in the silicon substrate 01 above the deep N-well 02.

Figure 4:
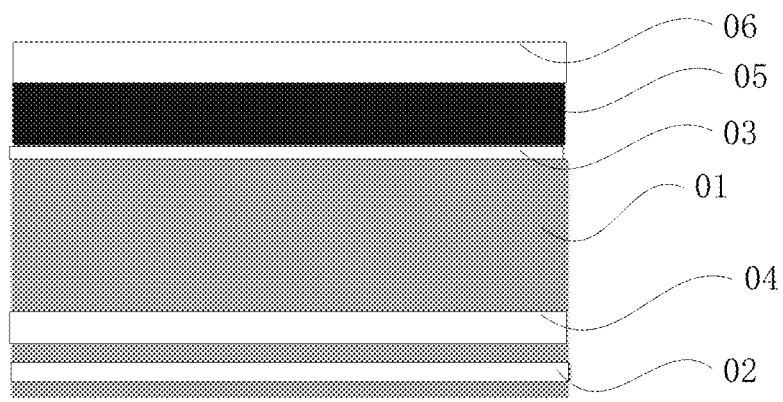
FIG. 4 is a schematic diagram of a structure with a hard mask layer formed on the first oxide layer according to the present application.

Step 3: forming a hard mask layer on the upper surface of the first oxide layer, and forming a second oxide layer on the hard mask layer. FIG. 4 is a schematic diagram of a structure with the hard mask layer formed on the first oxide layer according to the present application. In step 3, the hard mask layer 05 is formed on the upper surface of the first oxide layer 03, and the second oxide layer 06 is formed on the hard mask layer 05.

Figure 5:
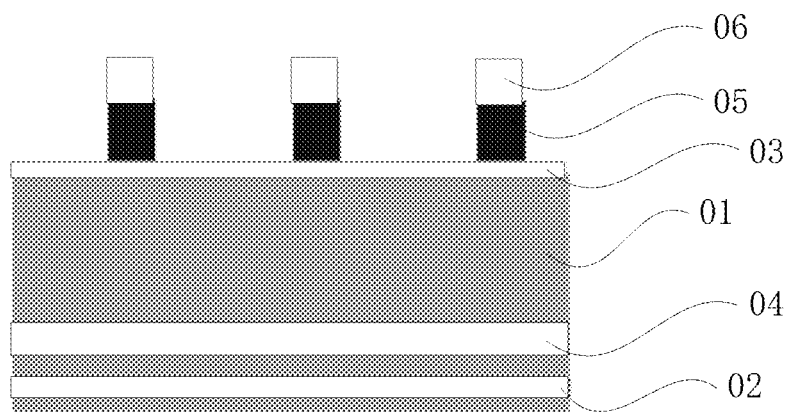
FIG. 5 is a schematic diagram of a structure with a second oxide layer and the hard mask layer being etched according to the present application.

Step 4: etching the second oxide layer and the hard mask layer until the upper surface of the first oxide layer is exposed, so as to form a plurality of structures spaced from each other. FIG. 5 is a schematic diagram of a structure with the second oxide layer and the hard mask layer being etched into separate structures according to the present application.

Figure 6:
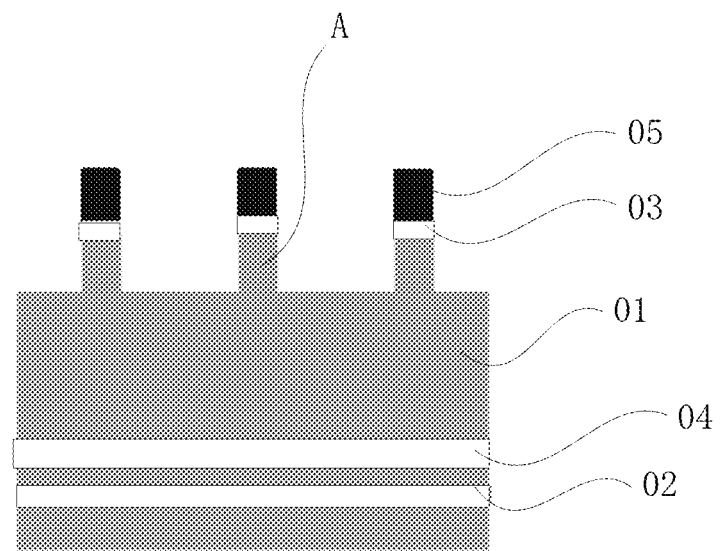
FIG. 6 is a schematic diagram after forming a first height of a fin structure according to the present application.

Step 5: etching the first oxide layer and the silicon substrate along each of the the structures until a first height of the structure is reached, so as to form a plurality of fin structures spaced from each other. FIG. 6 is a schematic diagram of forming the first height of the fin structure according to the present application. In step 5, the first oxide layer 03 and the silicon substrate are etched along the structures (the hard mask layer 05 and the second oxide layer) until the first depth A into the silicon substrate is exposed, thus the plurality of spaced-apart fin structures are formed.

In one example, the first height A in step 5 is in the range of 5-20 nm.

Figure 7:
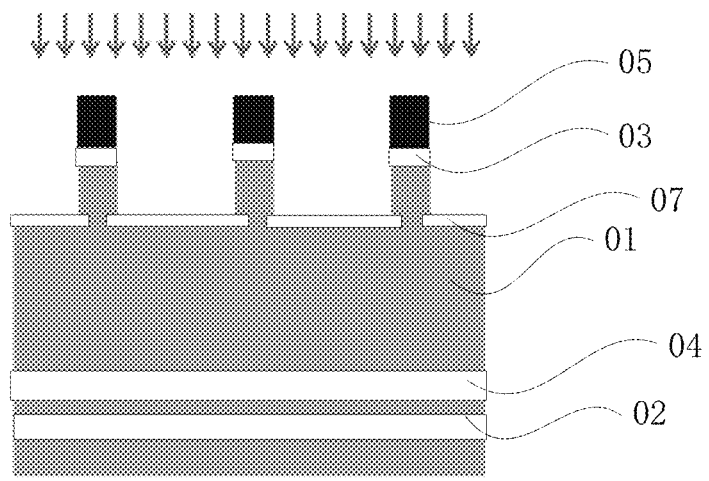
FIG. 7 is a schematic diagram of a structure with a first ion implantation layer being formed according to the present application.

Step 6: performing ion implantation for adjusting a threshold voltage, thus forming a first ion implantation layer at both sides of the fin structure root on the upper surface of the exposed silicon substrate. FIG. 7 is a schematic diagram of the structure with the first ion implantation layer being formed according to the present application. In step 6, the ion implantation for adjusting the threshold voltage VT is performed to form the first ion implantation layer 07 on the upper surface of the exposed silicon substrate, wherein the first ion implantation layer 07 is formed at both sides of the fin structure root thus the first ions have been implanted into the fin structure. In one example, according to step 6 of the embodiment, the first ion implantation reaches a depth about ⅓ of the width of the fin structure from each side, for the first height A of the fin.

In one example, in the embodiment of the present application, the first ion implantation layer in step 6 is performed to increase the threshold voltage VT.

Figure 8:
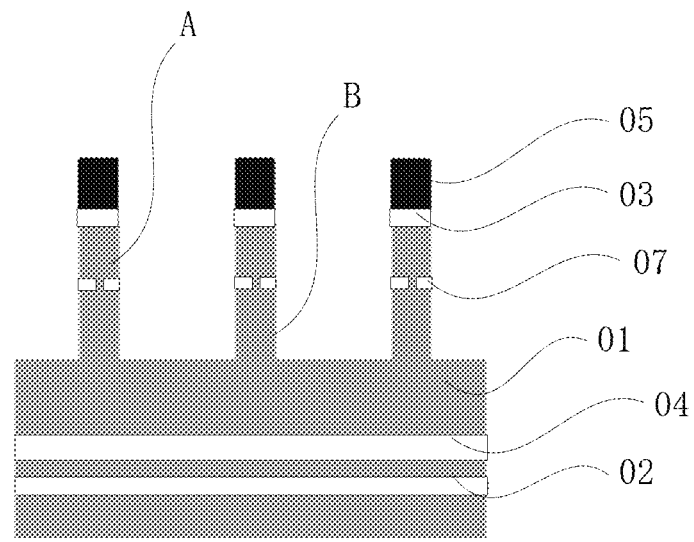
FIG. 8 is a schematic diagram of etching the silicon substrate to expose a second height of the fin structure according to the present application.

Step 7: etching the silicon substrate along the sidewalls of each of the plurality of fin structures until a second height in each fin structure is reached. FIG. 8 is a schematic diagram after etching the silicon substrate to reach the second height of the fin structure according to the present application. In step 7, the silicon substrate is etched along the sidewalls of the plurality of fin structures spaced from each other until the second height B is exposed.

In one example, in the embodiment of the present application, the second height B of the fin structure in step 7 is 30-50 nm.

In one example, in the embodiment of the present application, the second ion implantation layer in step 7 is an anti-punch-through ion implantation layer.

In one example, in the embodiment of the present application, the second ion implantation reaches a depth at about ⅓ of the width of fin structure from each side for the second height B in step 7.

Figure 9:
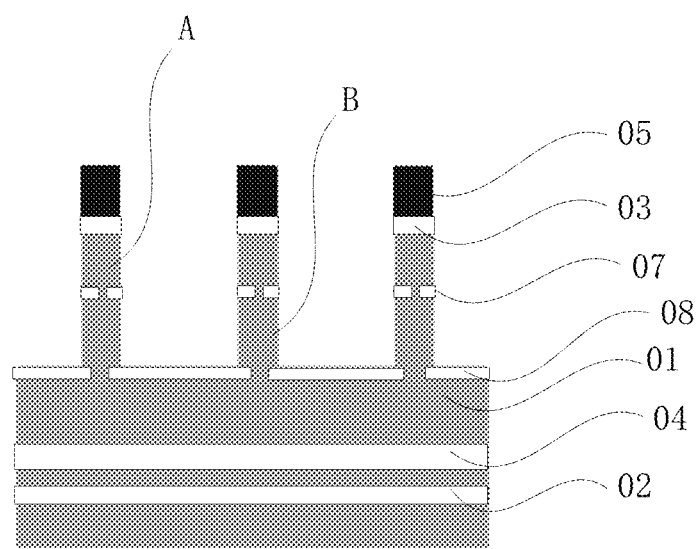
FIG. 9 is a schematic diagram of a structure with a second ion implantation layer formed on the surface of the silicon substrate according to the present application.

Step 8: forming a second ion implantation layer on the upper surface of the exposed silicon substrate, wherein the second ion implantation layer is formed on both sides of the fin structure root for the second height. FIG. 9 is a schematic diagram of a structure with the second ion implantation layer formed on the surface of the silicon substrate according to the present application. In step 8, the second ion implantation layer 08 is formed from both sides of the fin structure root at the bottom of the second height B and on the upper surface of the exposed silicon substrate.

Figure 10:
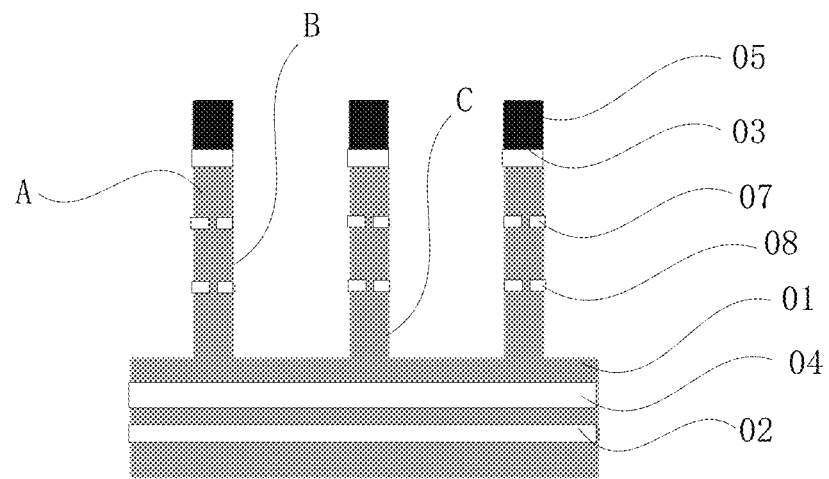
FIG. 10 is a schematic diagram of a structure with the silicon substrate being etched to expose a third height according to the present application.

Step 9: etching the silicon substrate along the sidewalls of each of the plurality of fin structures spaced from each other until a third height is exposed. FIG. 10 is a schematic diagram of a structure after etching the silicon substrate to expose the third height according to the present application. In step 9, the silicon substrate is etched along the sidewalls of each of the plurality of fin structures spaced from each other until the third height C of the fin is reached.

In one example, in the embodiment of the present application, the third height C in step 9 is in the range of 70-150 nm.

Figure 11:
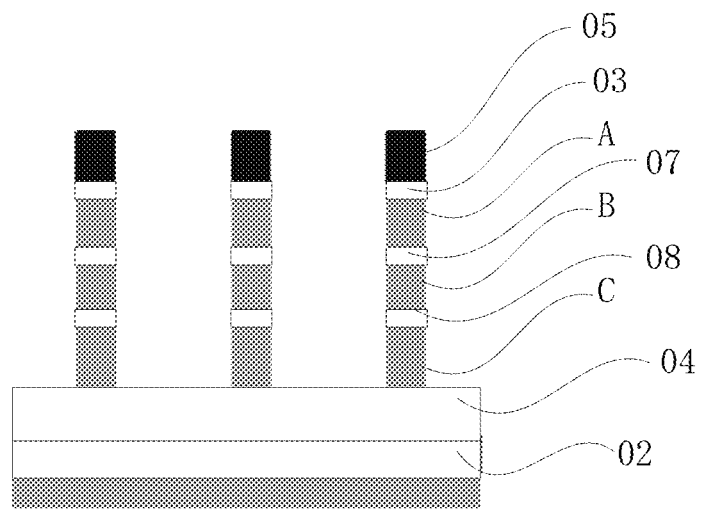
FIG. 11 is a schematic diagram of a structure with ions diffusing into the fin structure after annealing according to the present application.

Step 10: performing annealing treatment, during which the first and second implanted ions in each of the fin structures diffuse laterally into the full width regions of the fin structure, and diffuse longitudinally into the well region and the deep N-well region, which in turn diffuse into the upper surface of the silicon substrate. FIG. 11 is a schematic diagram of a structure with ions diffusing into the fin structure after annealing according to the present application. In step 10, the annealing treatment is performed, wherein the first ion implantation layer 07 and second ion implantation layer 08 in the fin structure respectively diffuse laterally into the full width regions of the fin structure (i.e., into the width regions of the fin structure at corresponding heights), as well as diffuse longitudinally into the well region 04 and the deep N-well 02 in the silicon substrate, followed by the well region 04 diffusing to the upper surface of the silicon substrate.

Figure 12:
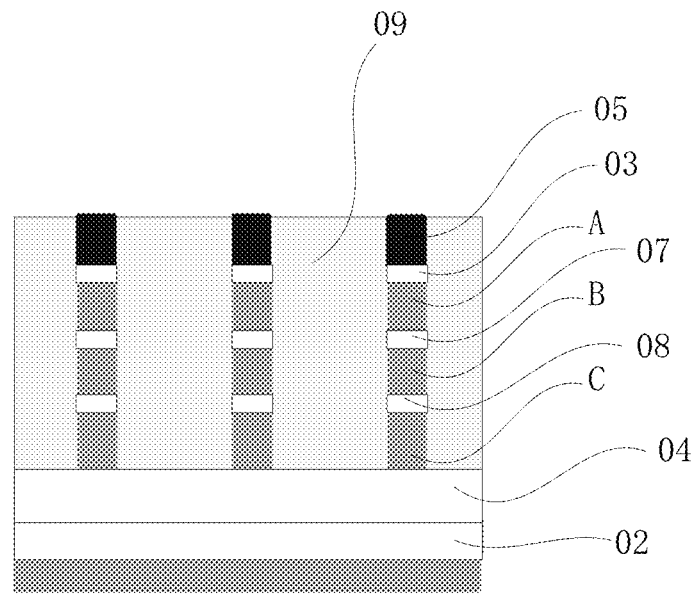
FIG. 12 is a schematic diagram of a structure with a third oxide layer formed by means of FCVD according to the present application.

Step 11: disposing a third oxide layer by means of FCVD, wherein the third oxide layer fills regions between two adjacent ones of the plurality of fin structures. FIG. 12 is a schematic diagram of a structure after forming the third oxide layer by means of FCVD according to the present application. In step 11, the third oxide layer 09 is disposed by applying the technique of FCVD, wherein the third oxide layer 09 fills regions between two adjacent ones of the plurality of fin structures spaced from each other.

Figure 13:
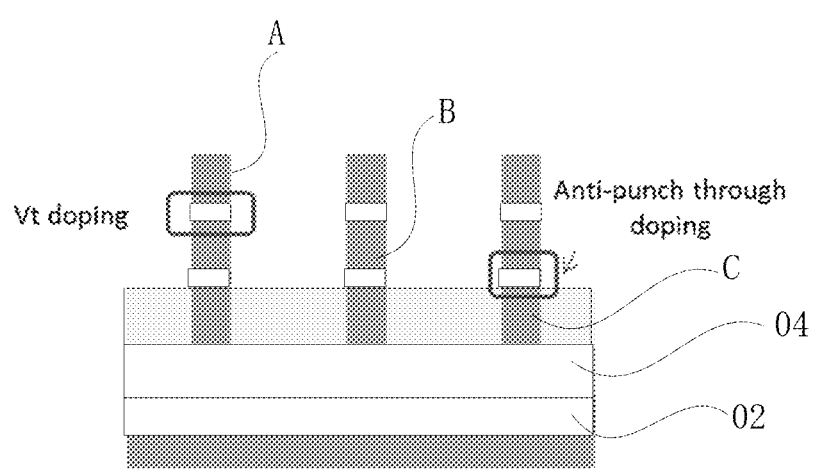
FIG. 13 is a schematic diagram of a structure with the third oxide layer being etched to expose the second ion implantation layer according to the present application.

Step 12: etching the third oxide layer until the out side of the second ion implantation layer in the fin structures is exposed. FIG. 13 is a schematic diagram of a structure after etching the third oxide layer to expose the outer edge of the second ion implantation layer according to the present application. In step 12, the third oxide layer 09 is etched until the outside surface of the second ion implantation layer 08 is exposed from the fin structure. In FIG. 13, the ion implantation doping layer for adjusting the threshold voltage Vt is referenced with "Vt doping", and the anti-punch through ion doping layer is referenced with "Anti-punch through doping."

To sum up, in the present application, the deep well and the well region are formed in the silicon substrate, followed by formation of the fin structure under a hard mask layer. After a portion of the fin is formed by etching, the first ion implantation for adjusting the threshold voltage is first performed at a first height of the fin, and the implanted ions laterally diffuse into the fin. The hard mask layer protects the fin structures from ion implantation damages to the fin top. structure After a second portion of the fin is formed by etching, the second anti-punch through ion implantation is performed at the second height, and the implanted ions laterally diffuse into the fin. Finally, the deep well, the well region, the first ion implantation layer for adjusting the threshold voltage, and the second ion implantation layer for anti-punch through together form the FinFET super well, which increases the carrier mobility, thereby improving the device performance. Therefore, the present application effectively overcomes punch through defects in the current process, contributing a high industrial value.

The above embodiments only exemplarily illustrate the principle and effects of the present application, bus are not intended to limit the present application. Any person familiar with this technology can modify or change the above embodiments without departing from the spirit and scope of the present application. Therefore, any equivalent modification or change made by those with ordinary knowledge in the technical field without departing from the spirit and technical concept disclosed by the present application shall still be covered by the claims of the present application.

What is claimed is:

1. A method for forming a FinFET super well, comprising steps of:
   step 1: providing a silicon substrate having a deep N-well, disposing a first oxide layer on the silicon substrate;
   step 2: forming a well region in the silicon substrate above the deep N-well;
   step 3: forming a hard mask layer on the first oxide layer, and forming a second oxide layer on the hard mask layer;
   step 4: patterning the second oxide layer and the hard mask layer to form a plurality of structures until an upper surface of the first oxide layer is exposed after the patterning, wherein the plurality of structures is spaced from each other;
   step 5: etching away the second oxide layer above the hard mask layer, the first oxide layer, and the silicon substrate along the plurality of structures until a first height of each of the plurality of structures is reached, wherein the hard mask layer, the first oxide layer, and the silicon substrate at both sides of the plurality of structures form a plurality of fin structures;

step 6: performing a first ion implantation to form a first ion implantation layer at both sides of a root of each of the plurality of fin structures at the first height, wherein the first ion implantation adjusts a threshold voltage;

step 7: etching the silicon substrate along sidewalls of each of the plurality of fin structures until a second height is reached;

step 8: performing a second ion implantation to form a second ion implantation layer at the both sides of the root of each of the plurality of fin structures at the second height;

step 9: etching the silicon substrate along the sidewalls of the plurality of fin structures until a third height is reached;

step 10: performing annealing treatment, wherein the first and the second ion implantation layers in the plurality of fin structures respectively diffuse laterally into full width regions of each of the plurality of fin structures, as well as diffuse longitudinally into the well region and the deep N-well, and an upper surface of the silicon substrate; and step 11: disposing a third oxide layer by means of FCVD, wherein the third oxide layer fills a region between two adjacent ones of the plurality of fin structures; and step 12: etching the third oxide layer until a side of the second ion implantation layer in one of the plurality of fin structures is exposed.

2. The method for forming the FinFET super well according to claim 1, wherein the first height in step 5 is in a range of 5-20 nm.

3. The method for forming the FinFET super well according to claim 1, wherein the first ion implantation layer reaches into each side of the root of one of the plurality of fin structures about ⅓ of a width of one of the plurality of fin structures in step 6.

4. The method for forming the FinFET super well according to claim 1, wherein the first ion implantation layer in step 6 increases the threshold voltage.

5. The method for forming the FinFET super well according to claim 1, wherein the second height in step 7 is in a range of 30-50 nm.

6. The method for forming the FinFET super well according to claim 1, wherein the second ion implantation layer in step 8 is an anti-punch through ion implantation layer.

7. The method for forming the FinFET super well according to claim 1, wherein the second ion implantation layer reaches into each side of the root of one of the plurality of fin structures about ⅓ of a width of said fin structures in step 7.

8. The method for forming the FinFET super well according to claim 1, wherein the third height in step 9 is in a range of 70-150 nm.

* * * * *